(12) United States Patent
Snijders

(10) Patent No.: US 7,253,107 B2
(45) Date of Patent: Aug. 7, 2007

(54) PRESSURE CONTROL SYSTEM

(75) Inventor: Gert Jan Snijders, Amersfoort (NL)

(73) Assignee: ASM International N.V. (NL)

( * ) Notice: Subject to any disclaimer, the term of this patent is extended or adjusted under 35 U.S.C. 154(b) by 229 days.

(21) Appl. No.: 10/871,897

(22) Filed: Jun. 17, 2004

(65) Prior Publication Data
US 2005/0279454 A1 Dec. 22, 2005

(51) Int. Cl.
*H01L 21/44* (2006.01)
*H01L 21/31* (2006.01)

(52) U.S. Cl. .................. 438/680; 438/758; 257/E21.17

(58) Field of Classification Search ............... 438/680, 438/758; 156/345.24, 345.29
See application file for complete search history.

(56) References Cited

U.S. PATENT DOCUMENTS

| | | | |
|---|---|---|---|
| 4,910,042 A | 3/1990 | Hokynar | |
| 5,462,603 A | 10/1995 | Murakami | |
| 5,882,419 A | 3/1999 | Sinha et al. | |
| 6,056,510 A | 5/2000 | Miura et al. | |
| 6,071,350 A | 6/2000 | Jeon et al. | |
| 6,119,532 A | 9/2000 | Park et al. | |
| 6,139,640 A * | 10/2000 | Ramos et al. | 118/715 |
| 6,202,681 B1 | 3/2001 | Kouketsu et al. | |
| 6,289,737 B1 | 9/2001 | Kouketsu et al. | |
| 6,508,268 B1 * | 1/2003 | Kouketsu | 137/488 |
| 6,616,898 B2 | 9/2003 | Hara et al. | |
| 2005/0180865 A1 * | 8/2005 | Heaps et al. | 417/410.3 |

FOREIGN PATENT DOCUMENTS

| | | |
|---|---|---|
| JP | 6266446 | 9/1994 |
| JP | 02000020138 A | 1/2000 |

\* cited by examiner

*Primary Examiner*—Alexander Ghyka
(74) *Attorney, Agent, or Firm*—Knobbe, Martens, Olson & Bear LLP

(57) ABSTRACT

A pressure control system allows gas to be evacuated out of a semiconductor process chamber at a substantially constant rate of mass flow. A gas line connects the process chamber to a vacuum pump. A controllable valve having a variable sized opening is positioned between the process chamber and the vacuum pump. A pressure sensor is in turn positioned between the valve and the vacuum pump, proximate the inlet to the vacuum pump. The size of the variable sized opening is regulated based upon the pressure in the gas line measured by the pressure sensor. The size of the valve opening is varied to maintain the pressure measured by the pressure sensor at a constant value. As a result, because the quantity of gas flowing through the gas line is proportional to the gas pressure, a substantially constant mass flow of gas out of the chamber and into the pump can be achieved.

14 Claims, 2 Drawing Sheets

PRESSURE CONTROL SYSTEM

BACKGROUND OF THE INVENTION

1. Field of the Invention

This invention relates generally to semiconductor processing and, more particularly, to pressure control systems for process chambers.

2. Description of the Related Art

Many semiconductor fabrication processes, or processes for fabricating integrated circuits, require that the pressure within a process chamber be varied between relatively high and relatively low pressures. For example, a chamber might be at, e.g., atmospheric pressure, for loading a semiconductor substrate into the chamber and then the chamber is pumped down or evacuated to a relatively low pressure, e.g., a vacuum, for processing of the substrate. When pumping down a process chamber from the relatively high pressure to the relatively low pressure, the pump-down rate is preferably not so large as to cause undesirable turbulence, which can stir up particles within the process chamber or within the piping network attached to the process chamber. Such turbulence or stirring up of particles is undesirable because these events can contaminate or otherwise adversely affect the quality of the process results on the substrates.

To avoid such undesirable turbulence, a process chamber pump-down typically occurs in two-steps. First, the pump-down is started through a small orifice valve, a so-called "slow-pump valve," which, because of the small size of the valve's opening, limits the rate at which gas can exit the chamber. This aids in minimizing both gas turbulence and the stirring up of particles. After some time pumping through the slow pump valve or after reaching a particular chamber pressure, a large opening valve, or so-called "fast-pump valve," is opened to complete the pump-down to the low processing pressures.

In addition to preventing the flow of exiting gas from being too large during pump-down, another pump-down requirement is that the pump-down time is preferably as short as possible, to allow for a maximum utilization of the chamber for processing. These are, however, conflicting requirements.

A vacuum pump system for a two step pump-down according to the prior art is shown in FIG. 1. The chamber pressure 10 can be measured by three different baratrons, or pressure sensors, 12, 14, and 16. The pressure sensor 16 is used for measuring and controlling the pressure of the chamber 10 during processing and is designed to measure pressures in a range of 0 to 2 Torr. The pressure sensor 12 is designed to measure pressures in a range of 0 to 1000 Torr and is used to determine if the chamber has reached atmospheric pressure and if the chamber can be opened to load or unload substrates. Optionally, a third pressure sensor 14 can also be used to more accurately measure intermediate pressures in the range between the pressures measured by sensors 16 and 12, for, e.g., processing at those intermediate pressures. The sensitive pressure sensor 16 can be provided with a valve to avoid exposure of the valve to high pressures. In that case, the pressure sensor 14 is used to detect if the pressure is below a predetermined level (e.g., 5 Torr or 10 Torr) so that the valve that brings pressure sensor 16 in communication with chamber 10 can be opened and so that the valve can be closed when the chamber pressure increases above the predetermined level. The pressure of the chamber 12 can be controlled using an optional butterfly valve or other variable opening valve or by using a variable $N_2$ gas ballast, all indicated by reference numeral 18. A pressure sensor 20 at the pump inlet 22 is typically used for safety purposes only, to detect unsafe pressure levels. Typically, this sensor 20 is designed to measure pressures in a range of 0 to 10 Torr.

The pump-down of the chamber 10 proceeds in an uncontrolled manner, as described above; that is, the rate of mass flow of gas out of the chamber 10 can vary continuously over the course of a pump down. Typically, a slow pump valve 24 is first opened. Then, after the chamber 10 has reached a particular pressure, a fast-pump valve 26 is opened to complete the pump-down of the chamber 12.

U.S. Pat. No. 6,139,640 proposes a method for pumping-down a process chamber in a more controlled manner, to decrease the amount of time needed to evacuate a vacuum chamber. That patent proposes providing a pump system with a mass flow controller (MFC) in a vacuum line. The process chamber pump-down is regulated using the mass flow controller to control the exiting gas flow at a constant value. Mass flow controllers, however, are additional and relatively complex and expensive components. Undesirably, their use increases both the cost and the complexity of processing systems. Further, mass flow controllers are susceptible to contamination and their use in a pump-down line can easily become problematic.

Accordingly, there exists a continuing need for systems and methods of pumping down a process chamber while minimizing gas turbulence and the stirring up of particulate matters.

SUMMARY OF THE INVENTION

According one aspect of the invention, a system is provided for semiconductor processing. The system comprises a process chamber, a vacuum pump and a gas line connecting the process chamber and the vacuum pump. A valve with a variable size opening is located in the gas line between the process chamber and the vacuum pump. The pump pressure sensor is configured to measure a pump gas pressure in the gas line between the valve and the pump. A valve controller is connected to the valve and the pump pressure sensor and is configured to regulate a size of the opening based upon the pump gas pressure.

According to another aspect of the invention a semiconductor processing system is provided. The system comprises a gas compartment having an entrance and an exit to an inlet of a pump. The entrance has a controllable variable size. A pressure sensor is also provided proximate the inlet of the pump. The pressure sensor is configured to sense a gas pressure at the inlet and the system is configured to regulate the size of the gas compartment entrance based upon the gas pressure to maintain the gas pressure substantially at a desired set point.

According to yet another aspect of the invention, a method is provided for semiconductor processing. The method comprises providing a semiconductor process chamber having a gas outlet, providing a pump having a gas inlet and providing a gas line connecting the gas outlet to the gas inlet. A variable size opening is located within the gas line. The chamber is pumped down through the opening in the gas line. Pumping down the chamber comprises varying the size of the opening depending upon a pressure of gas downstream of the opening. Varying the size of the opening in turn maintains the mass flow of gas out of the chamber at a substantially constant rate According to another aspect of the invention, a method for semiconductor processing is provided. The method comprises loading a substrate into a semiconductor processing chamber that is connected to a pump. The method further comprises evacuating the chamber using the pump, with a mass flow of fluid from the chamber into the vacuum pump controlled by regulating a pressure of the fluid proximate an entrance to the pump.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENT

Figure 1:
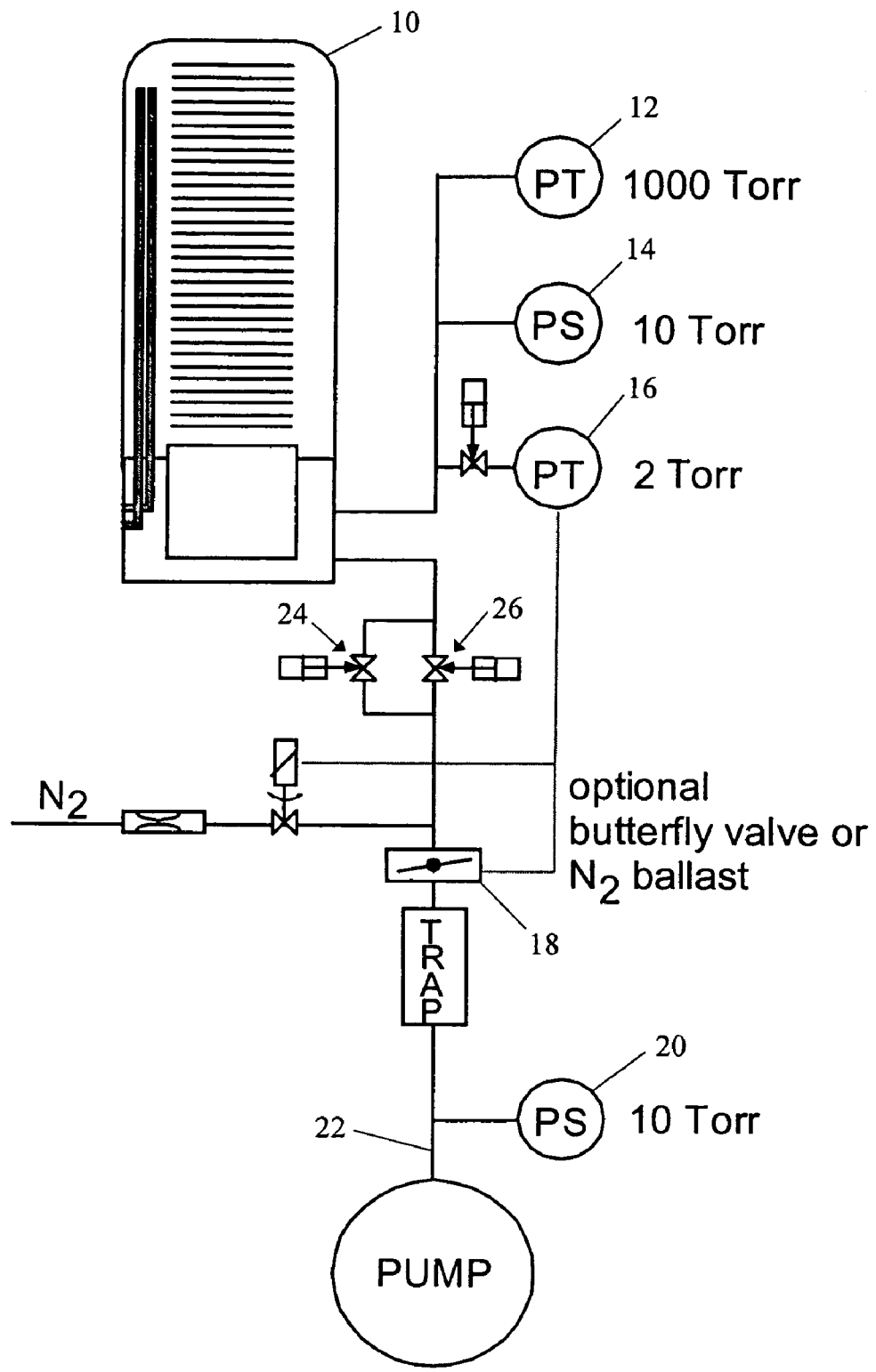
FIG. 1 is a schematic view of a prior art system for pumping down a process chamber in which the chamber pressure is utilized to control the pump-down.

As noted above, the evacuation, or pump-down, of a process chamber involves balancing the conflicting requirements of minimizing gas flow turbulence and particle agitation while maximizing process chamber utilization for substrate processing. It has been found that an optimal solution for reconciling these conflicting goals can be balanced by using a system capable of achieving a controlled mass flow rate during evacuation of the chamber. By having gas exit the process chamber at a roughly steady rate, turbulence and particle agitation caused by sudden changes in gas flow rates can be reduced. Moreover, the constant mass flow allows a set volume of gas to be consistently withdrawn, allowing the chamber to be pumped down more quickly than if the mass flow were allowed to decrease as the pressure in a process chamber decreases. It will be appreciated that such a mass flow decrease can occur where a valve allowing gas to flow out of a chamber has a constant sized opening.

Pressure control systems according to preferred embodiments of the invention provide an advantageously simple system, relative to, e.g., systems using mass flow controllers, for maintaining a substantially constant mass flow during pump-down. Preferably, a process chamber is connected to a pump using a gas line, or piping systems, that has a valve with a controllable, variable sized opening. A pump pressure sensor is configured to measure the pressure of gas at the pump's inlet. Preferably, the pump pressure sensor is located in the gas line between the vacuum pump and the variable opening. In this location, the pump pressure sensor can measure the gas pressure in the gas line between the vacuum pump and the variable opening, which pressure is equal to gas pressure at the pump inlet. The pressure sensor is also connected to the valve; the pressure measured by the sensor is used to determine the size of the variable opening. The pump preferably withdraws a constant volume of gas at a constant rate to minimize the affects that variable volume displacements and rates may have on the gas line pressure.

In preferred embodiments of the invention, the pressure sensor is configured to maintain the pressure in the gas line at a constant level during process chamber pump-down. The pressure in the gas line is proportional to the quantity of gas in the gas line. Assuming a constant volumetric displacement of the vacuum pump, maintaining the pressure at the pump inlet at a constant level during evacuation results in a substantially constant displacement of gas into the pump. Thus, a substantially constant mass flow of gas during process chamber evacuation can be achieved.

Advantageously, to regulate the gas pressure inside the vacuum chamber during substrate processing, the valve can also be connected to a chamber pressure sensor for measuring the chamber pressure. Preferably, measurements from the pump pressure sensor determine the size of the valve opening during pump-down, to control gas mass flow during pump-down, while measurements from the chamber pressure sensor determine the size of the valve opening during substrate processing, to control the chamber pressure during substrate processing.

Reference will now be made to the Figures, wherein like numerals refer to like parts throughout.

Figure 2:
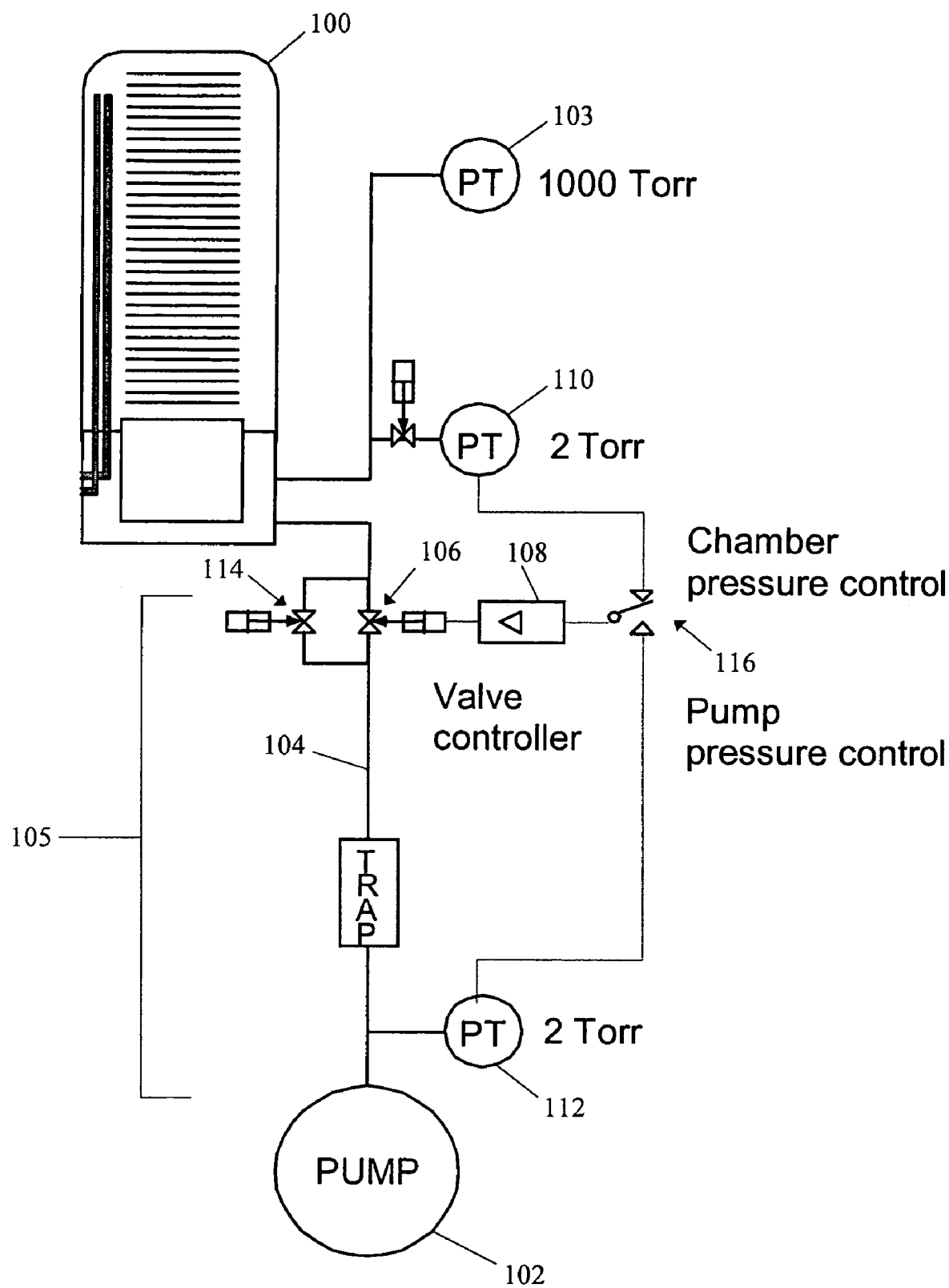
FIG. 2 is schematic view of a system selectively utilizing pump pressure and chamber pressure to control pump-down of a process chamber, in accordance with preferred embodiments of the invention.

FIG. 2 illustrates a pressure control system according to one preferred embodiment of the invention. A process chamber 100 is connected to a pump 102 via a gas line 104. It will be appreciated that the process chamber 100 is preferably a vacuum chamber that can be used for low pressure processes, such as low pressure chemical vapor deposition (LPCVD) or atomic layer deposition (ALD). The vacuum chamber can be part of a batch reactor that allows a plurality of semiconductors substrates, such as wafers, to be processed or it can be part of a single substrate system for processing one substrate at a time. An exemplary batch reactor is available commercially under the trade name A412® from ASM International, N.V. of The Netherlands. Exemplary process chambers are also described in U.S. Patent Application Pub. No. 2003/0180125 A1, published Sep. 25, 2003, entitled METHOD AND APPARATUS FOR BATCH PROCESSING OF WAFERS IN A FURNACE, and U.S. patent application Ser. No. 10/390,509, filed Apr. 13, 2003, and entitled PROCESS TUBE SUPPORT SLEEVE WITH CIRCUMFERENTIAL CHANNELS, the entire disclosures of which incorporated by reference in their entireties.

A variable opening valve 106 having an opening with a variable and controllable size regulates gas flow through the gas line 104. By regulating gas flow out from the chamber 100 to the pump 102, the variable opening valve 106 regulates the pressure of the process chamber 100. Thus, the valve 106 in effect demarcates a volume or compartment 105 in the gas line 104 between it and the entrance to the pump 102. The valve 106 serves as the entrance to the compartment, which leads to the inlet of the pump 102.

With continued reference to FIG. 2, a valve controller 108 controls the variable opening valve 106 and the size of its opening. In the illustrated exemplary embodiment, the valve controller 108 is connected to the chamber pressure sensor 110 and to the pump pressure sensor 112, both of which are preferably low pressure sensors designed to measure pressures in a range of about 0 to about 2 Torr. Depending on the circumstances and the desired pressure after pump-down, pressure sensors designed for other ranges can be used. For example, the pressure sensor 110 can have as an upper limit a pressure in the range of about 100 mTorr, about 1 Torr, about 10 Torr, about 100 Torr or about 1000 Torr or any intermediate number. The chamber pressure sensor 110 measures the gas pressure in the chamber 100, while the pump pressure sensor 112 measures the gas pressure in the gas line 104 between the variable opening valve 106 and the pump 102. Because the pressure measured by the pump pressure sensor 112 is the pressure of gas at the inlet to the pump 102, it may be referred to as the "actual pump pressure." Also illustrated is a pressure sensor 103, which is preferably a high pressure sensor designed to measure pressures in a range of about 0 to about 1000 Torr, thus allowing the sensor 103 to measure chamber pressures at about atmospheric pressure. Such a pressure sensor, designed to measure pressures in a large range, can be inaccurate when it measures low pressures, however, as the accuracy of a sensor is typically a certain percentage of its maximum range. Therefore, a combination of high accuracy at low pressures and the capability to measure pressures in a large range can be achieved by using a combination of a pressure sensor designed for a large range and a second pressure sensor designed for a low pressure range. It will be appreciated that while particular types of pressure sensors are identified above, the pressure sensors 110 and 112 are preferably simply chosen such that the sensor 112 is able to accurately measure the pressure that is desired at the inlet to the pump 102 during pump down and sensor 110 is able to accurately measure the pressure in the chamber 100 during processing.

The valve controller 108 preferably switches between the sensors 110 and 112 as inputs, depending upon the stage of semiconductor processing. For example, during pump-down after loading a batch of substrates into the chamber 100, the pressure of the gas line between the pump and the variable opening valve measured by the pump pressure sensor 112 is preferably used as an input for the pressure control, to allow for a steady mass flow rate during pump-down. During substrate processing, e.g., during LPCVD, the pressure of the chamber measured by the chamber pressure sensor 110 is preferably used as an input for the pressure control to allow for better process condition accuracy during processing, which condition is shown in FIG. 2.

Using the measurements of the sensor 110 or 112 as inputs, the valve controller 108 controls the variable opening valve 106. The valve controller 108 is preferably a computer and preferably controls the valve opening based on an input signal corresponding to the difference between a pressure set-point and the actual pressure measured by the pressure sensors 110 or 112. The valve controller 108 can be any controller known in the art, including, for example, PID controllers, H∞ controllers, model based controllers, or adaptive controllers. The valve controller 108 can also be a nested loop controller. In an example of such a nested loop controller, the outer loop uses an input signal corresponding to the difference between a pressure setpoint and the actual pressure, as measured by the pressure sensors 110 or 112, and generates a valve opening signal as an output signal. The valve opening signal preferably is a signal that indicates whether the size of the valve opening should be increased, decreased, or not changed to bring the actual pressure closer to, or to maintain the actual pressure at, the pressure set-point. The inner loop uses the valve opening signal and a valve feedback signal corresponding to the size of the actual valve opening as input and generates as an output a signal to be fed into a valve actuator (not shown), which directly controls the actual size of the valve opening. The parameters of the valve controller 108 are preferably adjustable so as to achieve a stable control. Preferably, at the start of the pump-down cycle, the valve 106 is opened slowly to avoid overshoot to too low a pressure, which can lead to oscillations that slow down stabilization of the chamber pressure at a desired pressure. On the other hand, the opening of the valve 106 is preferably not so slow as to unnecessarily lose time in achieving the desired pressure.

The pump 102 downstream of the valve 106 is preferably of a type that is capable of displacing a constant volume of gas at a substantially constant rate in normal operation. For example, the pump 100 can be a rotating vane vacuum pump that rotates at a substantially constant speed. Due to the constant rotation and the fixed volume delineated by the rotating vane, the displacement volume of such a pump is substantially constant. Advantageously, the constant displacement volume of the pump 102, in combination with a controlled and constant pressure at the pump inlet, results in a constant mass flow of gas evacuated from the chamber, which aids in minimizing gas turbulence within the process chamber 100 during pump-down. In addition, because differences in displacement over time can affect gas pressures within the gas line and, thus, make controlling mass flow more difficult, a constant volume displacement over time aids in ensuring the accuracy of the mass flow regulation using the valve 106 and the pump pressure sensor 112.

It will be appreciated that the controllable opening valve can be any controllable opening valve known in the art such as, for example, a proportional opening valve. In addition, the controllable opening valve can be a pneumatically operated valve where the opening is controlled by the pneumatic pressure applied to a pneumatic pressure input of the valve.

In addition, in some preferred embodiments of the invention the controllable opening valve 106 is the same valve as the gate valve or fast-pump valve, described above. Although not every controllable opening valve is designed to be used also for a shut-off function, several valves are available in the market that are able to combine these functions. An example of a valve suitable for this purpose is VEC-SH A9, commercially available from CKD Corporation, Nagoya, Japan. Such a valve is disclosed in U.S. Pat. No. 6,508,268, the entire disclosure of which is incorporated by reference herein. That valve is designed to control the pressure in a process chamber near atmospheric pressure.

Thus, according to preferred embodiments of the invention, the vacuum pump is operating in an approximately constant manner and the pressure at the inlet to the pump 102 is also controlled to be at a substantially constant value. Then the amount of gas or mass flow of the gas evacuated by the pump 100 is advantageously substantially constant. In particular, using signals from the pump pressure sensor 112 as an input, the controller 108 preferably regulates the size of the opening of the valve 106 to maintain the pressure in the gas line 104 downstream of the valve 106 at a substantially constant value. Preferably the pressure is maintained within about 50 percent of a set-point pressure, more preferably, within about 10 percent of the set-point pressure and, most preferably, within about 2 percent of the set-point pressure. Because the gas pressure in the gas line 104 downstream of the valve 106 is proportional, at a constant temperature, to the amount of gas in that part of the gas line 104, that gas pressure can be used to control the mass flow of gas into the pump 100. Thus, by maintaining the pressure at a particular set-point value while displacing a constant volume of gas with the pump 100, the mass flow of gas during the evacuation of the process chamber 100 can be controlled adequately in a simple manner, relative to, e.g., using MFC's for the same purpose. Preferably the mass flow rate out of the process chamber is maintained within about 50 percent of a desired value, more preferably, within about 10 percent of the desired value and, most preferably, within about 2 percent of the desired value. It will be appreciated that the set-point pressure value and the resulting target mass flow rate can be chosen such that both gas turbulence within the chamber 100 and the time necessarily for a pump-down cycle are minimized.

In addition, in some embodiments, during pump-down of the chamber, the pressure at the inlet of the pump 102 can be controlled in a non-constant manner, e.g., at two or more different levels during successive stages of the pump-down cycle. Such multiple pressure levels may be desirable because it is possible that the optimum mass flow during the initial stages of the pump-down process, when the pressure is still close to atmospheric pressure, is different from the optimum mass flow during later stages of the pump-down process, when the pressure is low. Advantageously, the system described herein allows the mass flow to be controlled at any desired level, such as a constant level or a level that changes as a function of time.

The completion of a pump-down can be determined in various ways. In some preferred embodiments, the simplicity of the pump-down system can advantageously be maintained by using either pressure sensors 110 or 112 to sense that the pump-down is complete.

For example, the pump pressure sensor 112 can be used to determine when the gas pressure has reached a desired value. It will be appreciated that, at the end of the pump-down cycle, as the chamber pressure reaches lower and lower values, the variable opening valve 106 will typically be controlled by the controller 108 to open further and further in an attempt to maintain the pump pressure set-point. At a certain point, however, the chamber 100 and gas line 104 cannot supply sufficient gas to maintain the pump pressure set-point. As a result, the actual pump pressure becomes lower than the pump pressure set-point. This occurrence can be used to indicate that the pump-down is complete. In other embodiments, the actual pump pressure can be allowed to further decrease to a predetermined value, which is understood by the valve and/or process controller to indicate that pump-down is complete. In other embodiments, a predetermined value of the chamber pressure can be used as an indication that the pump-down cycle is complete. In any case, the trigger value for indicating that pump-down is complete is preferably indicative of the desired chamber pressure for substrate processing.

Preferably, after reaching a predetermined value indicating that pump-down is complete, the controller 108 or switch 116 is programmed to switch from a pump pressure control mode to a chamber pressure control mode. Thus, during processing of substrates, or after the desired process pressure for a low pressure process has been reached, the controller 108 receives and uses inputs from the chamber pressure sensor 110, rather than the pump pressure sensor 112, to control the valve 106. By varying the size of the opening in the valve 106, the amount of gas, and, thus, the pressure inside the chamber 100 can be controlled during the chamber pressure control mode.

Preferably, the switch 116 is provided within the valve controller 108 and is a software switch rather than a hardware switch. The valve controller 108 can be a dedicated controller, receiving a pressure set-point from a higher-level process controller (not shown). In other embodiments, the valve controller 108 can be integrated within the process controller that controls other processing parameters.

Thus, the preferred embodiments of the invention allow the evacuation of gases from a process chamber in a simple manner. Advantageously, control over the mass flow of gas out of the chamber can be achieved with a simple pressure controller, rather than more costly and complicated mass flow controllers. Thus, there is preferably no MFC between the chamber 100 and the pump 102. Moreover, by controlling the pressure of gas flowing into a pump at a substantially constant value and, preferably by using a pump having a constant displacement, gas can be evacuated from the chamber quickly while minimizing turbulence in the chamber and agitation of contaminants and maximizing the utilization of the chamber.

It will be appreciated that while the valve controller can advantageously be set to maximize the utilization of the process chamber by controlling the pump pressure at a constant value, the controller can be set to give any desired pressure or mass flow profile over time. Thus, mass flows that vary with time are also possible. Moreover, the pump need not have a constant displacement. For example, if the displacement of the pump is known to vary with time, the controller may be set to compensate for this variance, such that the resultant mass flow is a desired mass flow. In such a case, achieving a constant mass flow may require varying the pump pressure with time.

In addition, while illustrated completely outside of the pump 102, it will be appreciated that the pump pressure sensor 112 can be located directly at the inlet to the pump 102 or inside an opening of the pump 102, so long as the pressure sensor 112 can adequately measure the pressure in the volume downstream of the valve 106.

Also, in addition to the valve 106 discussed above, additional valves can be present in or used to bypass the gas line 104. For example, other valves can be present directly in the gas line 104, upstream or downstream of the valve 106. Preferably, however, such additional valves do not interfere with the control of mass flow by the valve 106. In addition, with reference to FIG. 2, a slow pump valve 114 can be provided to bypass the valve 106. The valve 114 can used in a multiple part pump-down cycle to, e.g., control the mass flow during an initial part of the pump down cycle. The valve 114 can then be closed and the valve 106 used to control pump-down as described above. Unlike the valve 106, the valve 114 preferably has a constant sized opening.

Accordingly, it will be appreciated by those skilled in the art that other various omissions, additions and modifications can be made to the processes described above without departing from the scope of the invention. All such modifications and changes are intended to fall within the scope of the invention, as defined by the appended claims.

I claim:

1. A method for fabricating an integrated circuit, comprising:
   providing a semiconductor process chamber having a gas outlet;
   providing a pump having a gas inlet;
   providing a gas line connecting the gas outlet to the gas inlet, wherein a variable size opening is located within the gas line;
   providing a pressure sensor downstream of the opening; and pumping down the chamber, wherein pumping down the chamber comprises varying the size of the opening depending upon a pressure of gas measured by the pressure sensor downstream of the opening, wherein varying the size of the opening maintains the pressure at a substantially constant value, so as to maintain a mass flow of gas out of the chamber at a substantially constant rate.

2. The method of claim 1, wherein the process chamber is a batch reactor.

3. The method of claim 1, wherein the opening is an opening of a proportional opening valve.

4. The method of claim 1, wherein the pump is a rotating vane vacuum pump.

5. The method of claim 4, wherein a rotating vane of the rotating vane vacuum pump rotates at a substantially constant speed.

6. The method of claim 1, further comprising processing a substrate in the chamber.

7. The method of claim 6, wherein processing the substrate comprises low pressure chemical vapor deposition.

8. A method for fabricating an integrated circuit, comprising:
provICE providing a semiconductor process chamber having a gas outlet;
providing a pump having a gas inlet;
providing a gas line connecting the gas outlet to the gas inlet, wherein a variable size opening is located within the gas line;
pumping down the chamber, wherein pumping down the chamber comprises varying the size of the opening depending upon a pressure of gas downstream of the opening, wherein varying the size of the opening maintains a mass flow of gas out of the chamber at a substantially constant rate;
processing a substrate in the chamber and
further comprising measuring a gas pressure in the chamber and switching between using the gas pressure in the chamber to control the size of the gas line opening during processing of the substrate and using the gas pressure downstream of the opening to control the size of the gas line opening during pump down of the chamber.

9. The method of claim 8, wherein the size of the gas line opening is controlled during processing of the substrate to maintain the pressure in the chamber substantially constant.

10. The method of claim 1, wherein varying the size of the opening maintains the gas pressure in the gas line downstream of the opening at a substantially constant value at least during a period between a start and an end of pumping down the chamber.

11. The method of claim 10, wherein varying the size of the opening further comprises maintaining the gas pressure substantially constant at a value lower than the substantially constant value during another period between the start and the end.

12. The method of claim 10, wherein pumping down the chamber comprises maintaining the mass flow within about 50 percent of a reference rate.

13. The method of claim 12, wherein the mass flow is maintained within about 10 percent of the reference rate.

14. The method of claim 1, further comprising providing a bypass gas line for bypassing the opening, wherein pumping down the chamber comprises flowing gas through the bypass gas line during an initial stage of pumping down the chamber and then flowing gas through the opening.

* * * * *